(12) United States Patent
Sunohara

(10) Patent No.: US 8,379,400 B2
(45) Date of Patent: Feb. 19, 2013

(54) INTERPOSER MOUNTED WIRING BOARD AND ELECTRONIC COMPONENT DEVICE

(75) Inventor: Masahiro Sunohara, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 100 days.

(21) Appl. No.: 12/897,082

(22) Filed: Oct. 4, 2010

(65) Prior Publication Data

US 2011/0080713 A1    Apr. 7, 2011

(51) Int. Cl.
*H05K 7/00*    (2006.01)

(52) U.S. Cl. ........ 361/760; 361/783; 361/807; 361/790; 361/792

(58) Field of Classification Search ............ 361/748, 361/760, 783–785, 807, 809, 792
See application file for complete search history.

(56) References Cited

U.S. PATENT DOCUMENTS

| | | | |
|---|---|---|---|
| 6,521,984 B2* | 2/2003 | Matsuura | 257/678 |
| 7,545,029 B2* | 6/2009 | Wilson et al. | 257/685 |
| 2003/0128521 A1* | 7/2003 | Matayabas et al. | 361/705 |
| 2006/0263937 A1* | 11/2006 | Fukase et al. | 438/108 |
| 2009/0296360 A1* | 12/2009 | Doblar et al. | 361/767 |

FOREIGN PATENT DOCUMENTS

| JP | 2004-71719 A1 | 3/2004 |
|---|---|---|
| JP | 2004-79745 A1 | 3/2004 |

\* cited by examiner

*Primary Examiner* — Hoa C Nguyen
(74) *Attorney, Agent, or Firm* — Kratz, Quintos & Hanson, LLP

(57) ABSTRACT

An interposer mounted wiring board includes a wiring board including outermost wiring layers respectively on both surfaces thereof, the outermost wiring layers being electrically connected to each other through an inside of the board, and first and second interposers electrically connected to the outermost wiring layers on the both surfaces of the board, respectively. Each of the first and second interposers has a value of a coefficient of thermal expansion (CTE), the value being equal or close to a value of a CTE of a corresponding one of first and second electronic components to be mounted respectively on the first and second interposers. The base member of each of the interposers is preferably formed of silicon, and the base member of the wiring board is preferably formed of resin. Further, the electronic components are mounted respectively on surfaces of the interposers and thus form a semiconductor device, the surfaces being opposite to the surfaces of the interposers facing the wiring board.

7 Claims, 4 Drawing Sheets

INTERPOSER MOUNTED WIRING BOARD AND ELECTRONIC COMPONENT DEVICE

CROSS-REFERENCE TO RELATED APPLICATION

This application is based upon and claims the benefit of priority of the prior Japanese Patent Application No. 2009-232372 filed on Oct. 6, 2009, the entire contents of which are incorporated herein by reference.

FIELD

The embodiment discussed herein is related to a wiring board for use in mounting an electronic component such as a semiconductor element (chip) thereon. More particularly, it is related to an interposer mounted wiring board adapted for use in mounting an electronic component thereon via a surface-mounted interposer, and also to an electronic component device configured with this interposer mounted wiring board.

Such an interposer mounted wiring board is also referred to as a "package" in the following description for the sake of convenience, because the wiring board has the role as a package for mounting a semiconductor chip or the like thereon via an interposer.

BACKGROUND

The development of electronic devices and electronic component devices around digital home appliances or portable information terminals including multimedia devices has been advancing in recent years. Along with the advancement in the development of devices, semiconductor devices used in these electronic devices and the like have been increasingly required to have a smaller size, more functions, higher performances, and the like. In order to meet such a demand, a System on Chip (SOC) technology for integrating advanced system functions in a single chip has been receiving attention. In the SOC, a system which has been realized on a board in the past is realized on a single semiconductor chip (typically, a silicon chip). The SOC is quite advantageous because of lower power consumption, high performance, and reduction in mounting area.

Meanwhile, the prolonged development period for SOCs and the development risk associated with integration of various system functions into a single chip have been bottlenecks. For this reason, a System in Package (SIP) technology has been receiving attention, which has a possibility of realizing the functions equivalent to those of the SOC in a short period of time and also at low costs. Such an SIP is also called a System on Module. The SIP achieves a system by mounting multiple LSI chips (an active device such as a CPU, a passive device such as a DRAM, and the like) in a single package.

As one of the forms of semiconductor devices to which such an SIP technique is applied, there is a form which is a so called "multiple chip module (MCM)." The MCM is provided in various forms, one of which uses an interposer. In the MCM using an interposer, multiple chips are mounted on an interposer in parallel, and the interposer with the multiple chips is further mounted on a mounting wiring board (e.g., an organic substrate using an epoxy resin, polyimide resin or the like for a base member). Specifically, the chips are electrically connected to each other via the interposer and wiring board.

In addition, as the next generation package to be integrated into the aforementioned semiconductor device, a silicon interposer has been developed. The silicon interposer has a coefficient of thermal expansion (CTE) which is almost the same as that of a silicon chip to be mounted thereon. Accordingly, when the silicon interposer is used, there is substantially no thermal expansion mismatch between the interposer and the silicon chip. Thus, use of such a silicon interposer is advantageous in that the reliability in terms of temperature cycling test improves. In addition, even when a Low-K device (semiconductor device using a low-dielectric material for an interlayer insulating film) is mounted in this case, no damage is given thereto and there is an advantage that a semiconductor device to which a "strained silicon" technique is applied can be supported. In addition, a silicon substrate is advantageous in that fine wirings are easily formed because the silicon substrate is excellent in flatness as compared with an organic substrate (resin substrate).

Meanwhile, an active device such as a CPU ("logic" chip) to be integrated into the semiconductor device generates a large amount of heat during operation because of high-speed signal transmission required for the active device due to an increase in the density and functionality (higher clock frequency) of the active device. For this reason, unless the device temperature during operation is forcibly lowered, not only the active device may fail to deliver the performance as a "logic" element, but also the chip may break down in some cases. In order to prevent such an incident, a heat spreader (plate-like heat dissipating member made of a metal) for releasing the heat generated during the operation of the chip into the atmosphere is often arranged on the chip.

An example of the technique relating to the related art is described in Japanese Laid-open Patent Publication No. 2004-71719. The publication discloses a technique for mounting an electronic circuit device on a mounting board, the electronic circuit device including multiple semiconductor chips mounted on an interposer. In addition, another technique relating to the technique disclosed in the publication is described in Japanese Laid-open Patent Publication No. 2004-79745. This publication discloses a technique in which the rear surface of the silicon substrate forming the interposer is receded in such a manner that a penetrating conductive layer can protrude from the rear surface thereof, and a bump electrode made of solder or the like is formed on the leading edge of the penetrating conductive layer protruding from the rear surface.

In a case where a silicon interposer is used in a semiconductor device to which the SIP technique is applied, there are the above-described advantages in various points with no particular problems in a relationship with the chip to be mounted thereon. This is because the silicon interposer has a coefficient of thermal expansion (CTE) which is almost the same as that of the silicon chip to be mounted thereon. However, in a relationship with an organic substrate (build-up board, motherboard or the like) on which the silicon interposer is mounted, the following problems exist.

Specifically, a large difference between the CTE of the silicon interposer and the CTE of the organic substrate leads to a problem that the reliability in terms of temperature cycling test is reduced in a case where the silicon interposer is mounted on the organic substrate because of a large thermal expansion mismatch between the silicon interposer and the board. The problem is more apparent when the silicon interposer is large in size (e.g., 20 mm×20 mm or larger).

Since the silicon interposer is placed between the chips and the organic substrate, the size of the silicon interposer needs to be larger than a size obtained by adding up the sizes of the individual chips to be mounted thereon in a plan view. More specifically, since the required size of the interposer is relatively large, the amount of warpage caused by a thermal stress generated due to a difference between the CTE of the interposer and the CTE of the substrate also increases in accordance with the size of the interposer. This increase in the warpage causes a problem that a crack occurs in a terminal connection portion in some cases (reduction in the reliability in terms of temperature cycling test).

In addition, in a case of a module board on which a passive device such as a DRAM ("memory" chip) is mounted together with a "logic" chip, a heat spreader is thermally coupled to the "logic" chip in general as described above, but the heat spreader is thermally coupled also to the "memory" chip in the structure of this module (in other words, the chips are not thermally isolated from each other). In addition, the amount of heat generated from the "logic" chip is much larger than the amount of heat generated from the "memory" chip during operation. For this reason, the heat generated from the "logic" chip is easily conducted to the "memory" chip via the heat spreader. In addition, a DRAM is relatively weak against heat. Hence depending on the amount of heat conducted to the memory chip, the conducted heat leads to a problem which causes the "memory" chip to malfunction.

In addition, because of the presence of the heat spreader to be shared between the chips on the module board, there is a limitation that a "logic" chip with a lower grade (i.e., less power consumption but lower performance) has to be used in consideration of the influence of heat generation on the "memory" chip even though use of a chip with higher performance as the "logic" chip is desired.

The above-described problems in the related art are not necessarily unique to the case where a silicon interposer is used and mounted on an organic substrate. Regardless of whether or not "silicon" or "resin" is used, the problems may occur likewise in a case where an interposer has a predetermined CTE in a relationship with the chip to be mounted thereon, and a wiring board having a CTE different from the CTE of the interposer to a large extent in a relationship with the interposer is used.

SUMMARY

According to one aspect of the invention, an interposer mounted wiring board includes a wiring board having a first surface and a second surface opposite to the first surface, a first interposer electrically connected to a first wiring layer on the first surface of the wiring board and having a value of a coefficient of thermal expansion, the value being equal or close to a value of a coefficient of thermal expansion of a first electronic component to be mounted thereon, and a second interposer electrically connected to a second wiring layer on the second surface of the wiring board and having a value of a coefficient of thermal expansion, the value being equal or close to a value of a coefficient of thermal expansion of a second electronic component to be mounted thereon.

According to another aspect of the invention, an electronic component device includes an interposer mounted wiring board including a wiring board having a first surface and a second surface opposite to the first surface, a first interposer electrically connected to a first wiring layer on the first surface of the wiring board and having a value of a coefficient of thermal expansion, the value being equal or close to a value of a coefficient of thermal expansion of a first electronic component to be mounted thereon, and a second interposer electrically connected to a second wiring layer on the second surface of the wiring board and having a value of a coefficient of thermal expansion, the value being equal or close to a value of a coefficient of thermal expansion of a second electronic component to be mounted thereon, a first electronic component mounted on a surface of the first interposer, the surface being opposite to a surface of the first interposer facing the wiring board, and a second electronic component mounted on a surface of the second interposer, the surface being opposite to a surface of the second interposer facing the wiring board.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, a description is given of preferred embodiments of the present invention with reference to the accompanying drawings.

Figure 1:
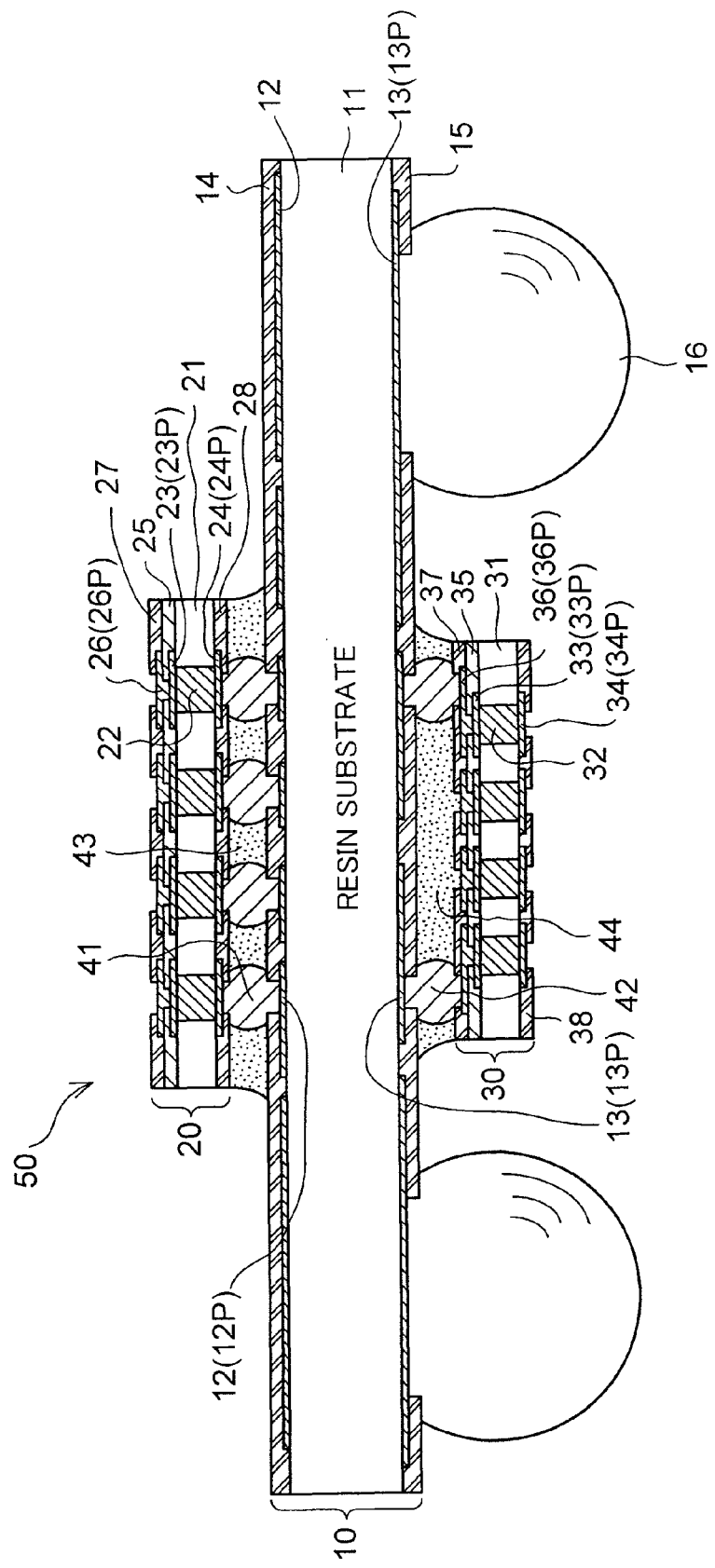
FIG. 1 is a cross-sectional view illustrating a configuration of an interposer mounted wiring board (package) according to an embodiment.

FIG. 1 is a diagram illustrating a configuration of an interposer mounted wiring board (package) according to an embodiment, in a cross-sectional form.

An interposer mounted wiring board 50 according to the embodiment includes a wiring board 10, and interposers 20 and 30 mounted respectively on both of the top and bottom surfaces of the wiring board 10 interposed therebetween.

The wiring board 10 needs at least to have a configuration in which outermost wiring layers of the wiring board 10 are electrically connected to each other through the inside of the board. A wiring layer may or may not be formed inside the board. Further, a material forming the main body of the board is not limited to a particular material, but a resin substrate (organic substrate) 11 using an epoxy resin or polyimide resin is employed in this embodiment for the base member.

Outermost wiring layers 12 and 13 each patterned in a required shape are formed respectively on the both surfaces of the resin substrate 11. Further, solder resist layers (insulating layers) 14 and 15 each serving as a protection film are formed so as to respectively cover the both surfaces of the outermost wiring layers 12 and 13 while portions corresponding to pads 12P and 13P defined at required positions of the respective wiring layers 12 and 13 are exposed.

Since a portion to be described herein is not a characterizing portion of the invention, a detailed illustration of the portion is omitted. In a case where wiring layers are formed inside the resin substrate 11, the outermost wiring layers 12 and 13 are electrically connected to each other through the wiring layers stacked one on top of another with an insulating layer interposed therebetween in the substrate and via holes (vias: conductor filled into each of the via holes) mutually connecting the wiring layers. The wiring boards in this form include a multi-layer structured wiring board, which may be formed by using a build-up process, for example. On the other hand, in a case where no wiring layer is formed inside the resin substrate 11, the outermost wiring layers 12 and 13 are electrically connected to each other via through holes (conductor filled into each of the through holes) appropriately formed at required positions of the resin substrate 11. Copper (Cu) is used as a material of the wiring layers 12 and 13. In addition, an epoxy resin is typically used as a material of the insulating layer.

The interposer 20 is bonded to the pads 12P and the interposer 30 is bonded to the pads 13P via conductive members such as solder bumps as described later. The pads 12P are exposed on one of the both surfaces of the wiring board 10 and the pads 13P are exposed on the other one of the both surfaces thereof. In addition, external connection terminals (solder balls 16 in the illustrated example) used for mounting the package 50 on a mounting board such as a motherboard are bonded to the pads 13P, respectively. For this reason, nickel (Ni) plating and gold (Au) plating are preferably applied in this order to the pads 12P and 13P. The plating is applied for improving contact characteristics of the pads via the Au layer when the pads are bonded to the solder bumps or the like and for increasing adhesion between the Cu layer and the Au layer via the Ni layer and then preventing diffusion of Cu into the Au layer, the Cu layer and the Au layer forming the pads 12P and 13P.

Note that, the pads 13P to which the solder balls 16 (external connection terminals) are bonded are provided on a peripheral portion (surface of the substrate 10) of the area on the wiring board 10 where the interposer 30 is mounted. In addition, metal pins may be bonded to the pads 13P by solder or the like, instead of the illustrated solder balls 16. In a case where the pins are bonded to the pads 13P, however, socket terminals into which the pins are inserted are appropriately provided at positions of the mounting board (such as motherboard), the positions corresponding to the pins.

Each of the interposers 20 and 30 respectively arranged on the both surfaces of the wiring board 10 is used for mounting a semiconductor chip (typically, a silicon chip) thereon, and it is sufficient for each of the interposers 20 and 30 to have a size at least equivalent to the mounting area of the chip. In this embodiment, the size of each of the interposers 20 and 30 is selected in such a way that the size becomes slightly larger than the size of a corresponding one of the chips.

In addition, each of the interposers 20 and 30 is selected in such a way that a coefficient of thermal expansion (CTE) of the base member thereof becomes the same value as a CTE of the corresponding one of the chips to be mounted thereon or a value close to the CTE of the chip. In this embodiment, as a material forming the base member of the interposers 20 and 30, a material whose coefficient of thermal expansion (CTE) is within a range from 2 ppm/° C. to 10 ppm/° C. inclusive is selected. Particularly, silicon substrates 21 and 31 each having the same CTE (=3 ppm/° C.) as the CTE of the chip is used for the purpose of practically eliminating a thermal expansion mismatch between the interposer and the silicon chip to be mounted thereon.

In addition, the interposers 20 and 30 are arranged at positions facing each other with the wiring board 10 interposed therebetween as illustrated. Specifically, the interposers 20 and 30 are mounted on the wiring board 10 in such a way that the mounting area of the interposer 30 is positioned within the mounting area of the interposer 20 when viewed in a plan view. The arrangement of the interposers 20 and 30 at the positions facing each other in the aforementioned manner makes it possible to achieve minimization of the length of wirings connecting the both interposers 20 and 30, which in turn contributes to high-speed transmission of signals.

Basically, the interposers 20 and 30 have the same configuration except that the interposers 20 and 30 are different in size. Specifically, through-hole electrodes 22 (32) are formed at required positions of the silicon substrate 21 (31) in the interposers 20 (30). The through-hole electrodes 22 are formed so that the edge surfaces of each of the through-hole electrodes 22 can be approximately flush with the both surfaces of the silicon substrate 21 (31), respectively. In addition, although not illustrated, an insulating layer (silicon dioxide film, for example) is formed between each through-hole electrode 22 (32) and the silicon substrate 21 (31). Further, wiring layers 23 and 24 (33 and 34) each patterned in a required shape are formed respectively on the both surfaces of the silicon substrate 21 (31), and portions of pads 23P and 24P (33P and 34P) are defined at required positions, respectively. The pads 23P and 24P (33P and 34P) are connected respectively to the both edge surfaces of each of the through-hole electrodes 22, the both edge surfaces exposed from the both surfaces of the silicon substrate 21 (31).

Further, an insulating layer 25 (35) made of an epoxy resin or the like is formed on one of the surfaces of the silicon substrate 21 (31) (the surface where pads 23P (33P) are formed), and a wiring layer 26 (36) patterned in a required shape is further formed on the insulating layer 25 (35). The portions of the pads 26P (36P) each defined at a required position of the wiring layer 26 (36) are connected respectively to the pad 23P (33P) of the wiring layer, which is the lower wiring layer thereof.

Moreover, solder resist layers (insulating layers) 27 and 28 (37 and 38) each serving as a protection layer are formed on the both surfaces of the interposer 20 (30) so as to cover the corresponding surfaces, respectively, while the portions of the pads 26P and 24P (36P and 34P) are exposed. Ni/Au plating is applied to the pads 26P and 24P (36P and 34P) exposed from the solder resist layers 27 and 28 (37 and 38). The reasons for applying the Ni/Au layer thereto are the same as in the case of the pads 12P and 13P in the wiring board 10.

The pads 24P and 36P on the surfaces of the interposers 20 and 30, which face the wiring board 10, are electrically and mechanically connected to the corresponding pads 12P and 13P on the wining board 10 via corresponding conductive members 41 and 42. Conductive paste or the like such as solder or silver (Ag) paste can be appropriately used as the conductive members 41 and 42. In this embodiment, solder pieces (bumps) are used. Tin (Sn)-lead (Pb)-based eutectic solder, environment-friendly lead free solder (Sn-silver (Ag), Sn—Ag—Cu, or the like) or the like is used for the solder pieces (bumps) 41 and 42.

Further, thermosetting underfill resin pieces 43 and 44 are filled into the gaps between the wiring board 10 and the interposers 20 and 30. The interposers 20 and 30 are mechanically bonded to the wiring board 10 by thermally curing the underfill resin pieces 43 and 44. A liquid thermosetting resin is used as the material of the underfill resin pieces 43 and 44 to be filled. An epoxy resin, silicone resin or the like is preferably used, for example. Such a liquid thermosetting resin is preferably used while filler (fine particles of an inorganic substance such as silica, alumina or calcium silicate) for adjusting the coefficient of elasticity and the coefficient of thermal expansion (CTE) of the resin is appropriately added. As a method for filling the gaps with the underfill resin pieces 43 and 44, a method such as an injection mold or underfill flow can be used.

In addition, a semiconductor element (chip) is mounted on the exposed surface (the surface where the pads 26P or the pads 34P are formed) of each of the interposers 20 and 30 via electrode terminals of the semiconductor chip as described later. For this reason, solder may be applied by pre-solder or the like, in consideration of the convenience for mounting the chip, to the pads 26P or 34P to be connected to the electrode terminals of the chip so that the pads 26P or 34P can be easily connected to the electrode terminals (such as solder bumps or gold (Au) bumps) when the chip is mounted thereon.

Figure 2:
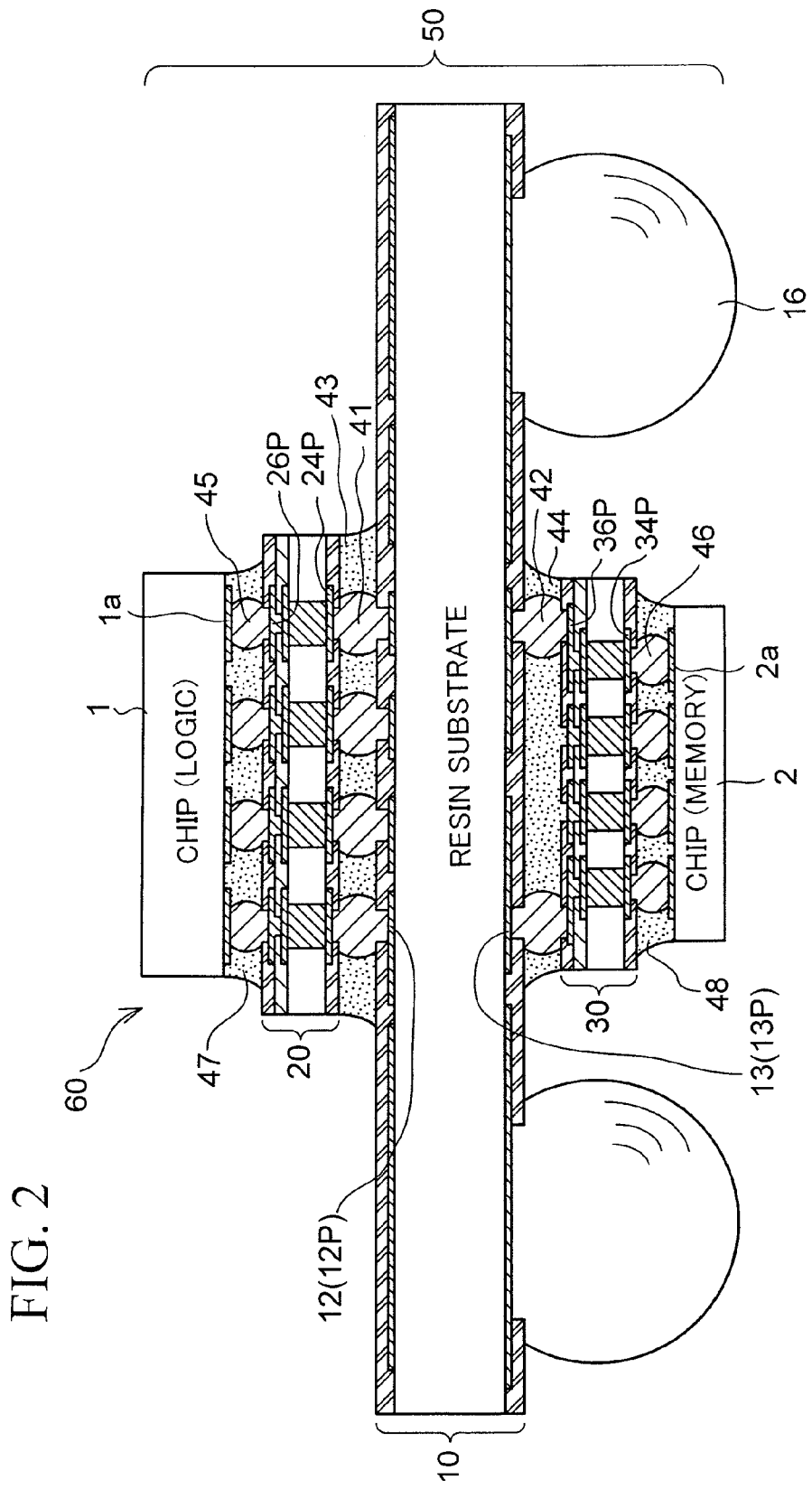
FIG. 2 is a cross-sectional view illustrating a state (an example of a semiconductor device (electronic component device)) where semiconductor chips (electronic components) are mounted respectively on both surfaces of the package illustrated in FIG. 1.

FIG. 2 illustrates a state where semiconductor chips each used as an electronic component are mounted respectively on the both surfaces of the package (interposer mounted wiring board) 50 of the present embodiment, i.e., FIG. 2 illustrates an example of the semiconductor device as an electronic component device in a cross-sectional form.

In the configuration of an illustrated semiconductor device 60, a "logic" chip 1 such as a CPU and a "memory" chip 2 such as a DRAM are mounted respectively on the surfaces of the interposers 20 and 30 in the package 50, the surfaces being opposite to the surfaces of each of the interposers 20 and 30, which face the wiring board 10. The "logic" chip 1 is a device generating a relatively large amount of heat during operation, whereas the "memory" chip 2 is a device relatively weak against external heat.

Basically, the chips 1 and 2 are fabricated by using the same process although the chips are different in that the chip 1 is an active device and the chip 2 is a passive device. Specifically, the chips are silicon chips (dies) obtained by forming multiple devices on one of surfaces of a silicon wafer by using a semiconductor process and then dicing (cutting into individual pieces) the wafer into device units. On the surface of each of the chips 1 and 2, where a circuit is formed, a required number of corresponding electrode pads (protruding electrode terminals) 1a or 2a are arranged in an area array form, for example.

The electrode pads (terminals) 1a and 2a of the chips 1 and 2 are electrically and mechanically connected to the corresponding pads 26P and 34P on the interposers 20 and 30 via the solder bumps 45 and 46, respectively (flip-chip mounting). Further, thermosetting underfill resin pieces 47 and 48 are filled into the gaps between the mounted chip 1 and the corresponding interposer 20 and between the mounted chip 2 and the corresponding interposer 30. The chips 1 and 2 are fixed respectively to the interposers 20 and 30 by thermally curing the underfill resin pieces 47 and 48 (mechanical bonding).

Figure 3:
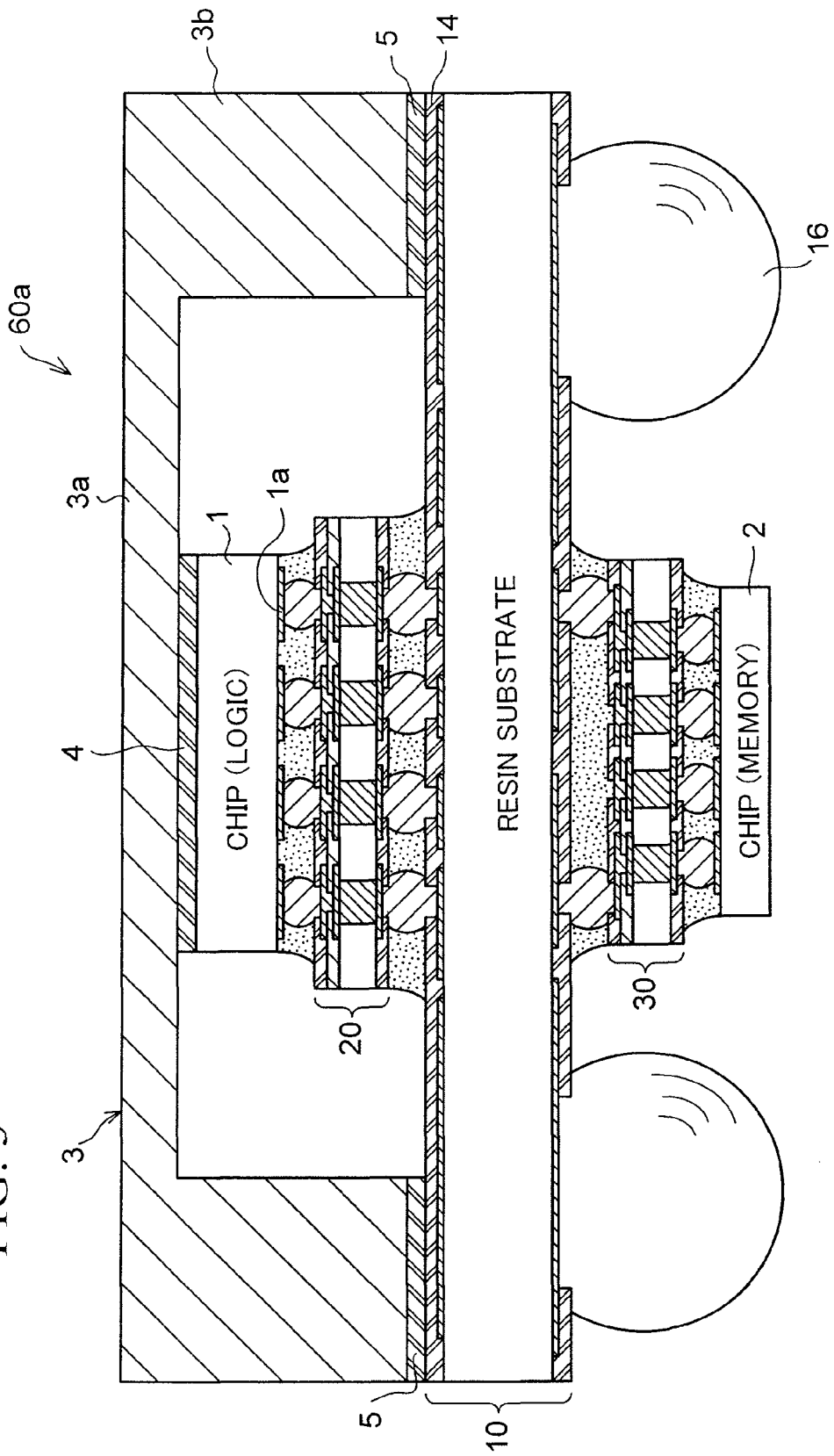
FIG. 3 is a cross-sectional view illustrating a state (another example of the semiconductor device) where a heat spreader is provided on the semiconductor device illustrated in FIG. 2.

FIG. 3 is a diagram illustrating, in a cross-sectional form, a state (another example of the semiconductor device) where a heat spreader serving as a heat dissipating member is disposed on the semiconductor device 60 illustrated in FIG. 2.

In an illustrated semiconductor device 60a, the heat spreader is denoted by reference numeral 3 and is provided for releasing, into the atmosphere, heat generated from the "logic" chip 1 such as a CPU during operation. The heat spreader 3 is made of metal. Typically, copper (Cu) is used for the material of the heat spreader 3, and nickel (Ni) plating is further applied to the surface of the heat spreader 3. The heat spreader 3 has a structure in which the primary portion of the heat spreader 3 is plate shaped (plate-like portion 3a) and a sidewall portion 3b is integrally formed around the plate-like portion 3a. The sidewall portion 3b is shaped into a square ring corresponding to the outer shape of the wiring board 10 when viewed in a plan view. Specifically, the heat spreader 3 is shaped so as to have a recessed portion for housing the interposer 20 and the "logic" chip 1 mounted thereon.

The chip 1 is bonded to an inner surface of the plate-like portion 3a of the heat spreader 3 with an adhesive (layer) 4 formed on the surface opposite to the surface of the chip 1 where the electrode pads (terminals) 1a are formed. A material having a good thermal conductivity is preferably used for the adhesive 4, and silver (Ag) paste is used, for example. Alternatively, a material called a thermal interface material (TIM) may be used to cause the chip 1 to thermally bond (adhere) to the inner surface of the plate-like portion 3a. As the thermal interface material, a material obtained by shaping a highly thermal conductive substance such as indium, a silicone (or hydrocarbon) grease, metal filler or graphite into a plate shape by a resin binder is preferably used.

In addition, the sidewall portion 3b of the heat spreader 3 is fixed to the wiring board 10 with an adhesive (layer) 5 formed at a required position on the wiring board 10 (solder resist layer 14). As a material for the adhesive 5, a thermosetting resin such as a silicone resin, epoxy resin, or polyimide resin is used.

Figure 4:
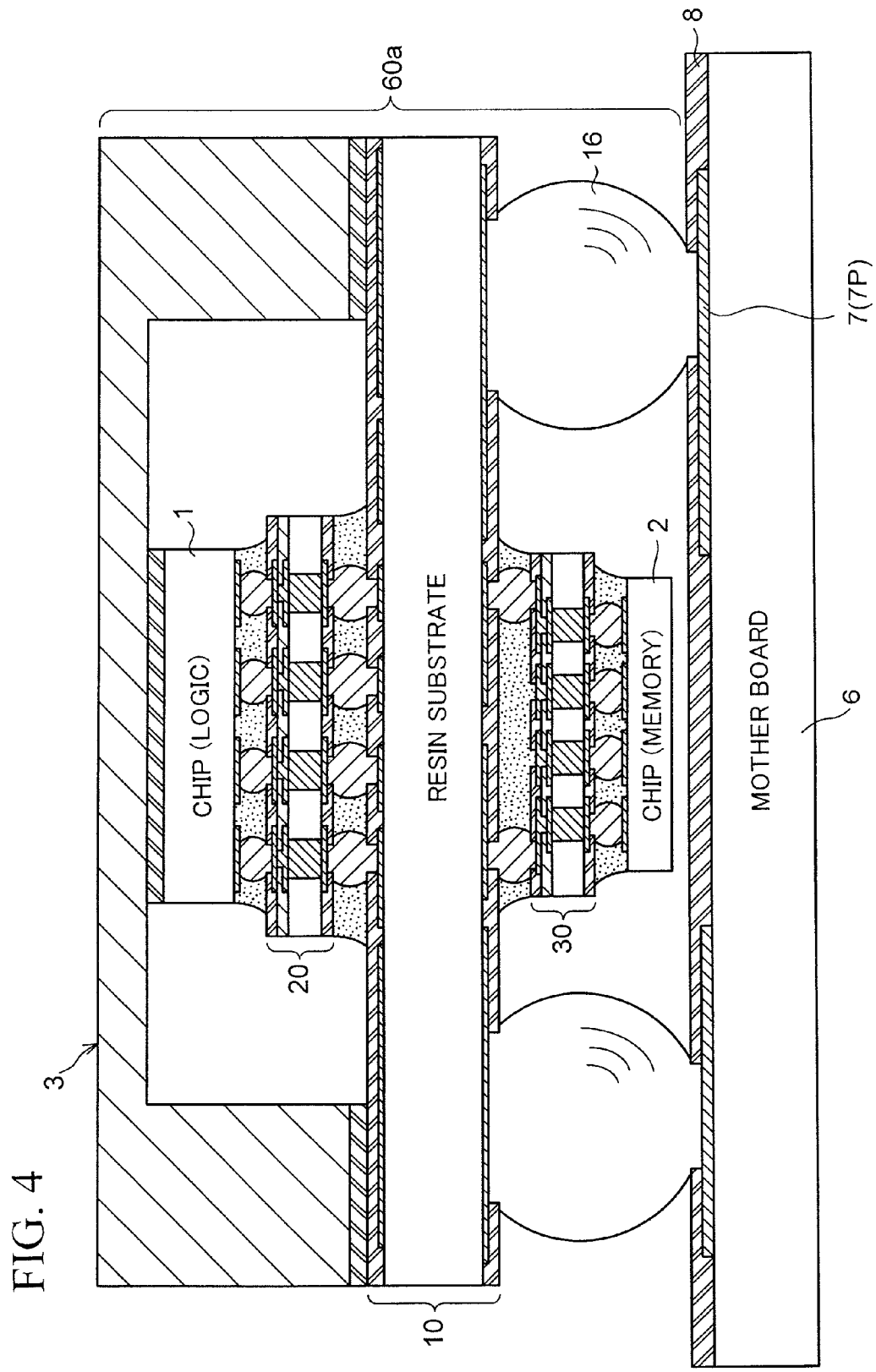
FIG. 4 is a cross-sectional view illustrating a state where the semiconductor device illustrated in FIG. 3 is mounted on a motherboard.

FIG. 4 is a diagram illustrating, in a cross-sectional form, a state where the semiconductor device 60a illustrated in FIG. 3 is mounted on a motherboard.

As illustrated, portions for pads 7P are defined at required positions of an outermost wiring layer 7 of a motherboard 6, and a solder resist layer 8 serving as a protection film is formed so as to cover the surface of the motherboard 6 while the portions for the pads 7P are exposed. As in the case of the resin substrate 11 of the wiring board 10, the motherboard 6 has a form of an organic substrate using an epoxy resin, polyimide resin or the like for the base member. The semiconductor device 60a is electrically connected to the corresponding pads 7P on the motherboard 6 via the external connection terminals (solder balls 16) provided on the wiring board 10.

Basically, the package (interposer mounted wiring board) 50 according to this embodiment can be fabricated by the following steps. First, the required wiring board 10 and the interposers 20 and 30 of two types are prepared. Then, the interposers 20 and 30 are mounted respectively on the both surfaces of the wiring board 10 while facing each other with the wiring board 10 interposed therebetween. Lastly, the gaps between the wiring board 10 and the interposers 20 and 30 are filled with the underfill resin pieces 43 and 44. Although an illustration of the detailed process chart is omitted herein, processing to be performed in each of the steps is described as follow.

<Fabrication of Wiring Board 10>

As a form of the resin substrate (organic substrate) 11 forming the main body of the wiring board, a resin substrate in which at least outermost wiring layers are electrically connected to each other through the inside of the substrate is sufficient. For example, a wiring board having a multi-layer structure obtained by a build-up process can be used. Specifically, the following processes are sequentially and repeatedly performed on each of both surfaces of a core substrate (glass epoxy substrate or the like) serving as a base member and as the center of the structure: forming an insulating layer; forming via holes in the insulating layer; and forming wiring patterns (wiring layers) including the inner portions of the via holes. As a material for the insulating layers, an epoxy resin is typically used, and copper (Cu) is used as a material for the wiring layers. The outermost wiring layers 12 and 13 formed through the aforementioned process are electrically connected with each other through the wiring layers appropriately formed at required positions in the substrate and the vias mutually connecting the wiring layers.

Ni plating and Au plating are applied in this order to the pads (Cu) 12P and 13P defined at the required positions of the outermost wiring layers 12 and 13. The reasons for applying the plating are as described above.

Further, the solder resist layers 14 and 15, each serving as a protection film, are formed respectively on the both surfaces of the resin substrate 11. For example, a photosensitive epoxy resin or the like is applied onto the resin substrate 11 and the wiring layers 12 and 13. Then, each of the applied resin layers is patterned in a required shape (shape without the portions for the pads 12P or 13P) to form the solder resist layers 14 and 15. Moreover, the solder balls 16, each serving as an external connection terminal, are bonded respectively to the pads 13P on the surface of the resin substrate 11 by reflow soldering, the surface being on a side to be mounted on the motherboard 6 (FIG. 4).

Through the steps described above, the wiring board 10 is fabricated. The size of the fabricated wiring board 10 is selected to be 30 mm×30 mm with a thickness of approximately 500 µm. In addition, the diameter of each of the solder balls 16 to be bonded is approximately 400 µm.

<Fabrication of Interposers 20 and 30, and Mounting of Interposers 20 and 30 on Wiring Board 10>

Basically, the interposer 20 for mounting the "logic" chip 1 thereon and the interposer 30 for mounting the "memory" chip 2 thereon can be fabricated by using the same process although the interposers 20 and 30 are different in size.

First, silicon substrates 21 and 31, each having a required thickness, are prepared. Then, required through holes are formed in each of the silicon substrates 21 and 31 by etching or the like. Then, an oxide film (silicon dioxide film) is formed by heat treatment or the like on the entire surfaces of the silicon substrates 21 and 31 including the inner walls of the through holes. Subsequently, the through holes are filled with a conductive material such as copper (Cu) by plating or the like to form the through holes 22 and 32. Further, the both edge surfaces of each of the through holes 22 and 32 are subjected to a grinding process or the like so as to be respectively flush with the both surfaces of a corresponding one of the silicon substrates 21 and 31. Thereafter, the wiring layers 23 and 24 as well as 33 and 34 each made of metal such as copper are formed respectively on the both surfaces of the corresponding silicon substrates 21 and 31 by sputtering, plating or the like.

Further, the insulating layers 25 and 35 each made of an epoxy resin, polyimide resin or the like are formed respectively on one (where the pads 23P are formed) of the surfaces of the silicon substrate 21 and one (where the pads 33P are formed) of the surfaces of the silicon substrate 31. Then, the wiring layers 26 and 36 made of metal such as Cu and formed by plating or the like are stacked on the insulating layers 25 and 35, respectively. Further, the protection films (solder resist layers) 27 and 28 are formed so as to respectively cover the both surfaces of the interposer while the portions of the pads 26P and 24P are exposed. In addition, the protection films (solder resist layers) 37 and 38 are formed so as to respectively cover the both surfaces of the interposer while the portions of the pads 36P and 34P are exposed. Thus, the interposers 20 and 30 are formed.

Note that, in the configuration example illustrated in FIG. 1, two wiring layers which are the wiring layers 23 and 26, and a single insulating layer which is the insulating layer 25 are formed on one of the surfaces of the silicon substrate 21 of the interposer 20, and only a single wiring layer which is the wiring layer 24 is formed on the other one of the surfaces thereof. Likewise, two wiring layers which are the wiring layers 33 and 36 and a single wiring layer which is the insulating layer 35 are formed on one of the surfaces of the silicon substrate 31 of the interposer 30 and only a single wiring layer which is the wiring layer 34 is formed on the other one of the surfaces thereof in the configuration example. However, as a matter of course, the number of wiring layers and the number of insulating layers to be formed are not limited to the number of corresponding layers illustrated in the configuration example. A required number of wiring layers and a required number of insulating layers may be stacked on the both surfaces of each of the silicon substrates 21 and 31 or multiple layers may be formed on only any one of the surfaces, as appropriate.

The interposers 20 and 30 can be mounted on the wiring board 10 in the same manner as in the case of normal flip-chip mounting. First, solder balls (solder pieces 41 and 42) are applied respectively to the pads 24P and 36P exposed from the protection films 28 and 37 of the interposers 20 and 30. Then, the respective solder pieces 41 and 42 are brought into contact with the corresponding pads 12P and 13P on the wiring board 10. Then, the solder balls are caused to melt by reflow soldering to electrically connect the pads 24P and 36P of the interposers 20 and 30 to the pads 12P and 13P of the wring board 10.

Further, the gaps between the wiring board 10 and the interposers 20 and 30 are filled with the thermosetting underfill resin pieces 43 and 44 made of an epoxy resin, silicone resin or the like to fix the interposers 20 and 30 to the wiring board 10.

Through the aforementioned steps, the package (interposer mounted wiring board) 50 according to the embodiment is fabricated. In this configuration, the size of the interposer 20 is selected to be 12 mm×12 mm with a thickness of approximately 150 µm, for example. In addition, the size of the interposer 30 is selected to be 10 mm×10 mm with a thickness of approximately 150 µm, for example. Further, each of the gaps between the wiring board 10 and the interposers 20 and 30 is selected to be approximately 50 µm.

<Fabrication of Semiconductor Chips 1 and 2 and Mounting of Chips 1 and 2 on Interposers 20 and 30>

For example, multiple devices ("logic" devices or "memory" devices) are fabricated in an array form on a silicon wafer having a size of 12 inches by performing a required device process on one of the surfaces of the silicon wafer. Then, a passivation film made of silicon nitride (SiN), phosphosilicate glass (PSG) or the like is formed on the surface the silicon wafer on the side where the devices are formed. Then, portions of the passivation film, which correspond to electrode pads to be defined at some portions of an aluminum (Al) wiring layer formed in a required pattern on each of the devices are removed by laser or the like.

Further, an insulating film made of a polyimide resin or the like is formed on the passivation film by photolithography. Thereafter, a thin metal layer (two-layer structure made of a titanium (Ti) layer or a chromium (Cr) layer for increasing adhesion with the electrode pads (Al), and a copper (Cu) layer stacked thereon) is formed by sputtering on the entire surface on the side where the insulating film is formed. Further, a plating resist patterned to have openings corresponding to the shapes of protruding terminals (electrode pads 1a and 2a) of the chip to be formed is formed on this thin metal film.

Next, the required protruding terminals (electrode pads 1a and 2a) are formed on the electrode pads (thin metal film) by electrolytic Cu plating using the thin metal film as a seed layer, the electrode pads exposed through the respective openings of the plating resist layer. Next, the rear surface (surface opposite to the surface where the devices are formed) of the wafer is ground by using an appropriate grinding device to reduce the thickness of the wafer to be a predetermined thickness (about 500 µm for the "logic" chips 1 and about 50 µm for the "memory" chips 2). Thereafter, the plating resist layer is removed. Further, the exposed thin metal film (Ti(Cr)/

Cu)) is removed by wet etching to expose the passivation film. Thereafter, predetermined surface cleansing or the like is performed.

Then, individual "logic" chips 1 (or "memory" chips 2) in each of which the protruding electrode pads 1a (or 2a) are formed on one of the surfaces thereof are obtained by cutting and dividing the silicon wafer into device units (chips) by a dicer or the like. Note that, when the wafer is cut and divided into the chip units, the size of each of the chips is selected to be 10 mm×10 mm for the "logic" chips 1, and the size of each of the chips is selected to be 8 mm×8 mm for the "memory" chips 2.

Moreover, the fabricated chips 1 and 2 are flip-chip mounted respectively on the corresponding interposers 20 and 30. Then, the gaps between the interposers 20 and 30 and the chips 1 and 2 are filled with the thermosetting resin pieces 47 and 48 to fix the chips 1 and 2 to the interposers 20 and 30, respectively.

In the steps described above, the chips 1 and are mounted on the interposers 20 and 30, respectively, after the interposers 20 and 30 are mounted on the both surfaces of the wiring board 10. However, the mounting steps are not necessarily performed in the aforementioned order. In the order opposite to the aforementioned one, the chips 1 and 2 may be mounted respectively on the interposers 20 and 30 and integrally fixed to the interposers 20 and 30, first, and then, the integrated structures may be mounted respectively on the both surfaces of the wiring board 10.

Through the aforementioned steps, the semiconductor device 60 illustrated in FIG. 2 is fabricated.

<Fabrication of Heat Spreader 3 and Attachment of Heat Spreader 3 to Semiconductor 60>

First, the heat spreader 3 to be thermally coupled to the "logic" chip 1 is prepared. A relatively thick copper plate having a size of about 30 mm×30 mm is prepared, for example. Then, while a portion along the periphery of the copper plate is left, the other portion (center portion) is removed to form a recessed shape with a required depth by a pressing or etching process or the like. Accordingly, a structure formed of the plate-like portion 3a the primary portion of which is shaped in a plate shape, and the sidewall portion 3b integrally formed around the plate-like portion 3a is obtained as illustrated. Further, nickel (Ni) plating is applied to the entire surface of the structure. In this manner, the required heat spreader 3 can be obtained.

Next, an appropriate amount of the adhesive 4 having a good thermal conductivity such as Ag paste is applied to the rear surface (surface opposite to the surface where electrode pads 1 are formed) of the chip 1. In addition, an appropriate amount of the adhesive 5 for fixing the heat spreader 3, such as a silicone resin, is applied to a required position on the wiring board 10 (solder resist layer 14). Moreover, the heat spreader 3 is positioned onto the wiring board 10 so as to house the interposer 20 and the chip 1 in the recessed portion. Then, the adhesives 4 and 5 are thermally cured, thereby, bonding (fixing) the heat spreader 3 onto the chip 1 and the wiring board 10.

Through the aforementioned steps, the semiconductor device 60a illustrated in FIG. 3 is fabricated.

As described above, with the configuration of the interposer mounted wiring board 50 according to this embodiment and the configuration of the semiconductor device 60 (60a) using the interposer mounted wiring board 50, the silicon interposers 20 and 30 for mounting the "logic" chip 1 and the "memory" chip 2, respectively, are mounted respectively on the both surfaces of the wiring board 10 while facing each other with the wiring board 10 interposed therebetween.

Thus, it is sufficient for each of the interposers 20 and 30 to have a size which is the same as or slightly larger than the size of a corresponding one of the chips 1 and 2. Specifically, when the "logic" chip and "memory" chip are mounted in parallel on the same interposer as in the case of the conventional example, the size of the interposer needs to be larger than the size obtained by adding up the individual sizes of the chips, in a plan view. In the package (interposer mounted wiring board 50) of this embodiment, however, the size of each of the silicon interposers 20 and 30 can be made relatively small.

Accordingly, the degree of warpage caused by a thermal stress generated due to a difference between the coefficient of thermal expansion (CTE) of each of the silicon interposers 20 and 30 and the coefficient of thermal expansion of the wiring board 10 (resin substrate 11) can be significantly reduced. Specifically, a thermal expansion mismatch between each of the interposers and the organic substrate (resin substrate 11) can be effectively reduced. Thus, the reliability of temperature cycling test can be improved.

In addition, the wiring board 10 is interposed between the silicon interposer 20 on which the "logic" chip 1 is mounted and the silicon interposer 30 on which the "memory" chip 2 is mounted. Thus, the heat generated from the "logic" chip 1 on one of the surfaces of the wiring board 10 is unlikely to be conducted to the "memory" chip 2 on the other one of the surfaces thereof. Specifically, the wiring board 10 functions as a kind of heat insulating member, and the state where the chip 1 on the one of the surfaces and the chip 2 on the other one of the surfaces are thermally insulated from each other with the wiring board 10 interposed therebetween can be secured. Accordingly, the inconvenience which causes the "memory" chip receiving the thermal conduction to malfunction as observed in the related art can be resolved.

Moreover, conventionally, there is a limitation that a "logic" chip with a lower grade (i.e., less power consumption but lower performance) has to be used in terms of the heat to be released therefrom even though use of a chip with higher performance as the "logic" chip is desired. According to the embodiment discussed herein, there is no such limitation, however. The "logic" chip 1 and the "memory" chip 2 can be separately arranged with the wiring board 10 interposed therebetween. Thus, influence of the heat generated from the "logic" chip 1 on the "memory" chip 2 does not have to be taken into consideration, and such a configuration makes it easier to select a high performance device as the "logic" chip 1.

Moreover, the same silicon is used as the materials respectively forming the base members of the interposers 20 and 30 in the embodiment. However, if the interposers 20 and 30 are significantly different in size or shape, or the arrangement positions thereof are different, the amounts of the thermal stress generated between each of the interposers 20 and 30 and the wiring board 10 may differ from each other between the top and bottom surfaces of the wiring board 10, or the positions where the thermal stress occurs may differ from each other. In this case, warpage is expected to occur in the wiring board 10. With respect to this case, in the configuration of the interposer mounted wiring board 50 according to the embodiment, the interposers 20 and 30 are arranged while facing each other with the wiring board 10 interposed therebetween in such a way that the center of the interposers 20 coincides with the center of the interposer 30. In this arrangement configuration, the stresses generated on the top surface of the wiring board 10 and the bottom surface thereof cancel out each other. Thus, the suppression of warpage of the wiring board 10 can be achieved.

Moreover, in terms of preventing warpage of the wiring board 10, the shapes (when viewed in a plan view) of the interposers 20 and 30 are preferably formed in the same shape (similar shape). Further, the areas of the interposers 20 and 30 are preferably made similar to each other (a difference between the areas is within a range of 50% inclusive). In this case, even when the areas or shapes of the chips 1 and 2 to be mounted respectively on the interposers 20 and 30 are different from each other, warpage of the wiring board 10 can be suppressed if the shapes of the interposers 20 and 30 satisfy any one of the aforementioned conditions.

In the aforementioned embodiment, an example of the case where the silicon substrates 21 and 31 are used as the base members of the interposers 20 and 30, respectively, is described. However, as it is apparent from the gist of the invention (interposers each having a predetermined coefficient of thermal expansion in relation with a corresponding electronic component (chip) to be mounted on the interposer are mounted respectively on the both surfaces of a wiring board interposed therebetween), the material forming the interposers is not limited to silicon as a matter of course. Basically, it is sufficient if the material is selected in such a way that the coefficient of thermal expansion (CTE) of each of the interposers becomes the same value as the CTE of the corresponding one of the chips to be mounted thereon or a value close to this.

For example, ceramic such as aluminum nitride (CTE: 4.5 ppm/° C.) or alumina (CTE: around 6.7 ppm/° C.) may be used. However, because of the need to reduce the thermal expansion mismatch with the silicon chips 1 and 2 to be mounted on the respective interposers as much as possible, a ceramic material having a CTE which is made as close as possible to the CTE (=3 ppm/° C.) of the chips 1 and 2 is preferably selected.

Moreover, an organic material such as an epoxy resin or polyimide resin can be used as well. Note that, when an epoxy resin or the like is used, although there is no particular problem in relation with the wiring board 10 (resin substrate 11). However, in relation with the chips 1 and 2, the thermal expansion mismatch with the chips 1 and 2 tends to expand in this case as compared with the case where silicon or ceramic is used. For this reason, it is preferable to adjust the CTE of the resin by adding filler (fine particles of an inorganic substance such as silica, alumina or calcium silicate), for example, in the resin to be used and thereby to make the CTE of the resin as close as possible to the CTE of the chips 1 and 2.

Moreover, an example of the case where the resin substrate 11 is used as the main body of the board of the wiring board 10 is described in the aforementioned embodiment, but the form of the main body of the board is not limited to this, and a ceramic substrate may be used, for example.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the invention has been described in detail, it should be understood that the various changes, substitutions, and alterations could be made hereto without departing from the spirit and scope of the invention.

What is claimed is:

1. An interposer mounted wiring board comprising:
   a wiring board, a main body of which is made of resin, which has a first surface and a first wiring layer at the first surface, and which has a second surface opposite to the first surface and a second wiring layer at the second surface;
   a first interposer, a base member of which is made of silicon, which has first through-hole electrodes and first pads connected to the first through-hole electrodes, which is mounted on the first surface of the wiring board in a manner that at least one of the first pads is electronically connected to the first wiring layer via a bump, and which has a value of a coefficient of thermal expansion, the value being equal or close to a value of a coefficient of thermal expansion of a first electronic component to be mounted thereon; and
   a second interposer, a base member of which is made of silicon, which has second through-hole electrodes and second pads connected to the second through-hole electrodes, which is mounted on the second surface of the wiring board in a manner that at least one of the second pads is electrically connected to the second wiring layer via a bump, and which has a value of a coefficient of thermal expansion, the value being equal or close to a value of a coefficient of thermal expansion of a second electronic component to be mounted thereon,
   wherein the first interposer and the second interposer are arranged respectively at positions facing each other with the wiring board interposed therebetween, and
   underfill resins are filled between the first interposer and the first surface of the wiring board, and between the second interposer and the second surface of the wiring board, respectively.

2. The interposer mounted wiring board according to claim 1, wherein
   the value of the coefficient of thermal expansion of the first interposer is at a range of 2 ppm/° C. or larger and 10 ppm/° C. or smaller, and the value of a coefficient of thermal expansion of the second interposer is at a range of 2 ppm/° C. or larger and 10 ppm/° C. or smaller.

3. An electronic component device comprising:
   an interposer mounted wiring board including:
   a wiring board, a main body of which is made of resin, which has a first surface and a first wiring layer at the first surface, and which has a second surface opposite to the first surface and a second wiring layer at the second surface;
   a first interposer, a base member of which is made of silicon, which has first through-hole electrodes and first pads connected to the first through-hole electrodes, which is mounted on the first surface of the wiring board in a manner that at least one of the first pads is electrically connected to the first wiring layer via a bump, and which has a value of a coefficient of thermal expansion, the value being equal or close to a value of a coefficient of thermal expansion of a first electronic component to be mounted thereon; and
   a second interposer, a base member of which is made of silicon, which has second through-hole electrodes and second pads connected to the second through-hole electrodes, which is mounted on the second surface of the wiring board in a manner that at least one of the second pads is electrically connected to the second wiring layer via a bump, and which has a value of a coefficient of thermal expansion, the value being equal or close to a value of a coefficient of thermal expansion of a second electronic component to be mounted thereon,
   wherein the first interposer and the second interposer are opposed to each other while the wiring board is interposed therebetween, and underfill resins are filled between the first interposer and the first surface of the wiring board, and between the second interposer and the second surface of the wiring board, respectively;

a first electronic component mounted on a surface of the first interposer, the surface being opposite to a surface of the first interposer facing the wiring board; and a second electronic component mounted on a surface of the second interposer, the surface being opposite to a. surface of the second interposer facing the wiring board.

4. The electronic component device according to claim 3, wherein the first electronic component is a device which generates a larger amount of heat during operation than the second electronic component.

5. The electronic component device according to claim 4, further comprising a heat dissipating member thermally coupled to the first electronic component and thermally isolated from the second electronic component.

6. The electronic component device according to claim 4, further comprising an external connection terminal bonded to the second surface of the wiring board.

7. The electronic component device according to claim 3, wherein the value of the coefficient of thermal expansion of the first interposer is at a range of 2 ppm/° C. or larger and 10 ppm/° C. or smaller, and the value of a coefficient of thermal expansion of the second interposer is at a range of 2 ppm/° C. or larger and 10 ppm/° C. or smaller.

* * * * *

UNITED STATES PATENT AND TRADEMARK OFFICE
CERTIFICATE OF CORRECTION

PATENT NO.        : 8,379,400 B2
APPLICATION NO.   : 12/897082
DATED             : February 19, 2013
INVENTOR(S)       : Masahiro Sunohara It is certified that error appears in the above-identified patent and that said Letters Patent is hereby corrected as shown below:

On the Title Page, Item (30) should read as follows:

(30)  Foreign Application Priority Data
October 6, 2009  (JP) ................................2009-232372

Signed and Sealed this
Fourteenth Day of May, 2013

Teresa Stanek Rea
*Acting Director of the United States Patent and Trademark Office*